United States Patent
Ni

(10) Patent No.: US 10,298,870 B2
(45) Date of Patent: May 21, 2019

(54) C-MOS PHOTOELECTRIC CHARGE TRANSFER CELL, AND MATRIX SENSOR COMPRISING A SET OF SUCH CELLS

(71) Applicant: NEW IMAGING TECHNOLOGIES, Verrieres le Buisson (FR)

(72) Inventor: Yang Ni, Palaiseau (FR)

(73) Assignee: NEW IMAGING TECHNOLOGIES, Verrieres le Buisson (FR)

( * ) Notice: Subject to any disclaimer, the term of this patent is extended or adjusted under 35 U.S.C. 154(b) by 0 days.

(21) Appl. No.: 15/318,240

(22) PCT Filed: Jun. 12, 2015

(86) PCT No.: PCT/EP2015/063122
§ 371 (c)(1),
(2) Date: Dec. 12, 2016

(87) PCT Pub. No.: WO2015/189363
PCT Pub. Date: Dec. 17, 2015

(65) Prior Publication Data
US 2017/0118429 A1 Apr. 27, 2017

(30) Foreign Application Priority Data
Jun. 13, 2014 (FR) ..................... 14 55397

(51) Int. Cl.
*H04N 5/378* (2011.01)
*H04N 5/225* (2006.01)
(Continued)

(52) U.S. Cl.
CPC ......... *H04N 5/378* (2013.01); *H01L 27/1461* (2013.01); *H01L 27/1463* (2013.01);
(Continued)

(58) Field of Classification Search
CPC ...... H04N 5/378; H04N 5/225; H04N 5/2355; H04N 5/2253; H04N 5/35518;
(Continued)

(56) References Cited

U.S. PATENT DOCUMENTS 6,677,656 B2 1/2004 Francois
6,921,934 B2 7/2005 Patrick
(Continued)

FOREIGN PATENT DOCUMENTS

EP 2648404 A1 10/2013
FR 2910713 A1 6/2008
(Continued)

OTHER PUBLICATIONS

International Search Report in PCT/EP2015/063122 dated Sep. 1, 2015, with English translation. 4 pages.
(Continued)

*Primary Examiner* — Luong T Nguyen
(74) *Attorney, Agent, or Firm* — Womble Bond Dickinson (US) LLP

(57) ABSTRACT

The invention concerns a C-MOS photoelectric cell with charge transfer, comprising an embedded photodiode (PPD) likely to be exposed to photons, formed by a doped area of a first type in a substrate of an opposite type, and means for transferring the charges generated by exposing the photodiode to photons to a floating diffusion (FD), and means for reading, on the floating diffusion, a voltage representative of the quantity of charges transferred. This cell is remarkable in that the depletion area of the photodiode junction under zero bias voltage extends essentially through the entire thickness of the doped area of a first type, such that the junction capacitance of said photodiode and the capacitive noise are minimized, and in that, during exposure to photons, the reading is carried out under a condition of equilibrium
(Continued)

between the charges generated by photo-conversion and the charges lost by evaporation. The invention also proposes a matrix sensor formed from such cells with means forming a barrier to the diffusion of the charges evaporated from one cell to a neighboring cell.

17 Claims, 12 Drawing Sheets

(51) Int. Cl.
*H01L 27/146* (2006.01)
*H04N 5/355* (2011.01)
*H04N 5/235* (2006.01)

(52) U.S. Cl.
CPC .. *H01L 27/14612* (2013.01); *H01L 27/14643* (2013.01); *H04N 5/2253* (2013.01); *H04N 5/35518* (2013.01); *H04N 5/2355* (2013.01)

(58) Field of Classification Search
CPC ........... H01L 27/14612; H01L 27/1463; H01L 27/14643; H01L 27/1461
See application file for complete search history.

(56) References Cited

U.S. PATENT DOCUMENTS

| | | | |
|---|---|---|---|
| 7,022,965 B2* | 4/2006 | Manabe | ............ H01L 27/14609 250/208.1 |
| 7,443,437 B2* | 10/2008 | Altice, Jr. | .............. H04N 5/363 348/294 |
| 7,705,900 B2 | 4/2010 | Guidash | |
| 8,853,756 B2* | 10/2014 | Theuwissen | ...... H01L 27/14612 257/292 |
| 2004/0188727 A1 | 9/2004 | Patrick | |
| 2011/0025898 A1* | 2/2011 | Ni | .......................... H04N 3/155 348/308 |
| 2012/0085888 A1* | 4/2012 | Endo | ................. H01L 27/14609 250/208.1 |
| 2015/0008493 A1* | 1/2015 | Ni | ..................... H01L 27/14616 257/292 |

FOREIGN PATENT DOCUMENTS

| | | |
|---|---|---|
| FR | 2986906 A1 | 8/2013 |
| WO | WO 02059974 A1 | 8/2002 |
| WO | WO 2004112376 A1 | 12/2004 |
| WO | WO 2007021626 A2 | 2/2007 |
| WO | WO 2009027449 A1 | 3/2009 |
| WO | WO 2010103464 A1 | 9/2010 |
| WO | WO 2012092194 A1 | 7/2012 |

OTHER PUBLICATIONS

Search Report in French Application No. 1455397 dated Feb. 4, 2015, with English translation coversheet. 3 pages.
Prigozhin et al. "CCD Charge Injection Structure at Very Small Signal Levels." Transactions on Electron Devices, vol. 55, No. 8 (Aug. 2008). pp. 2111-2120.

* cited by examiner

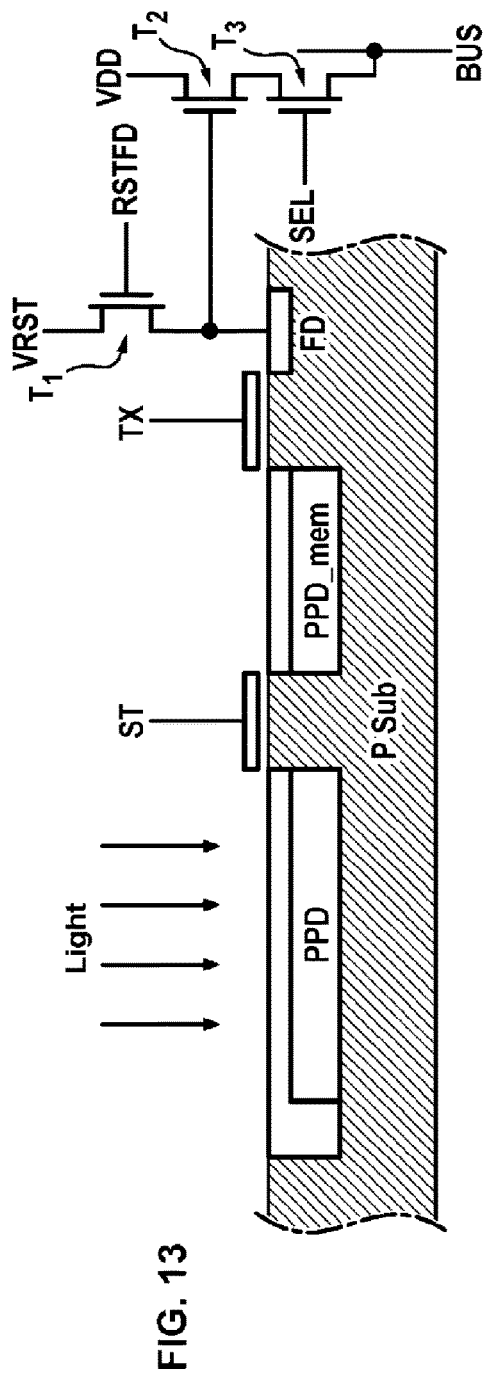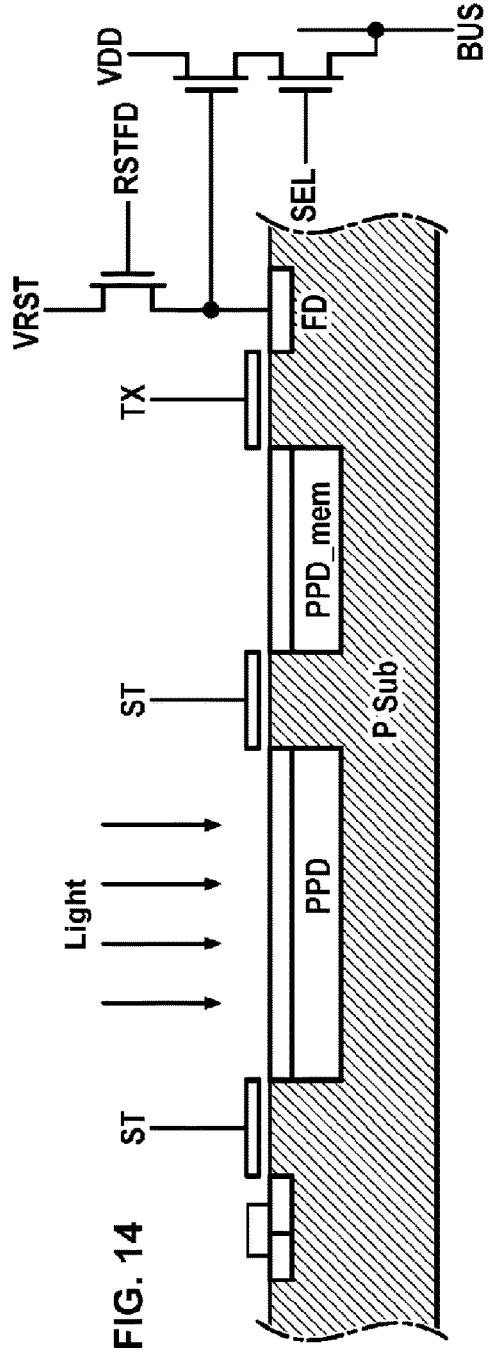
FIG. 13
FIG. 14

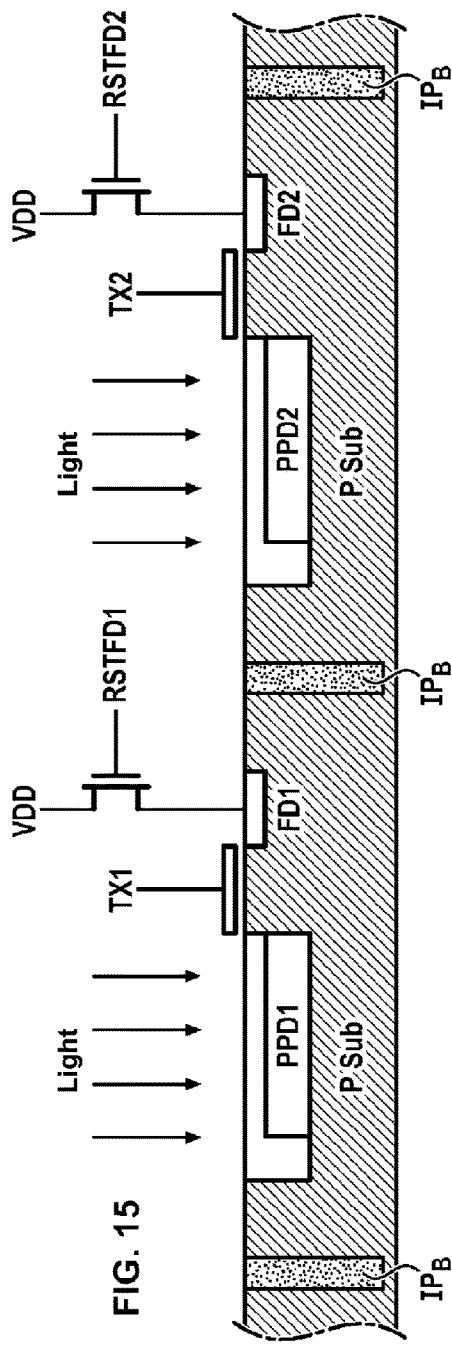
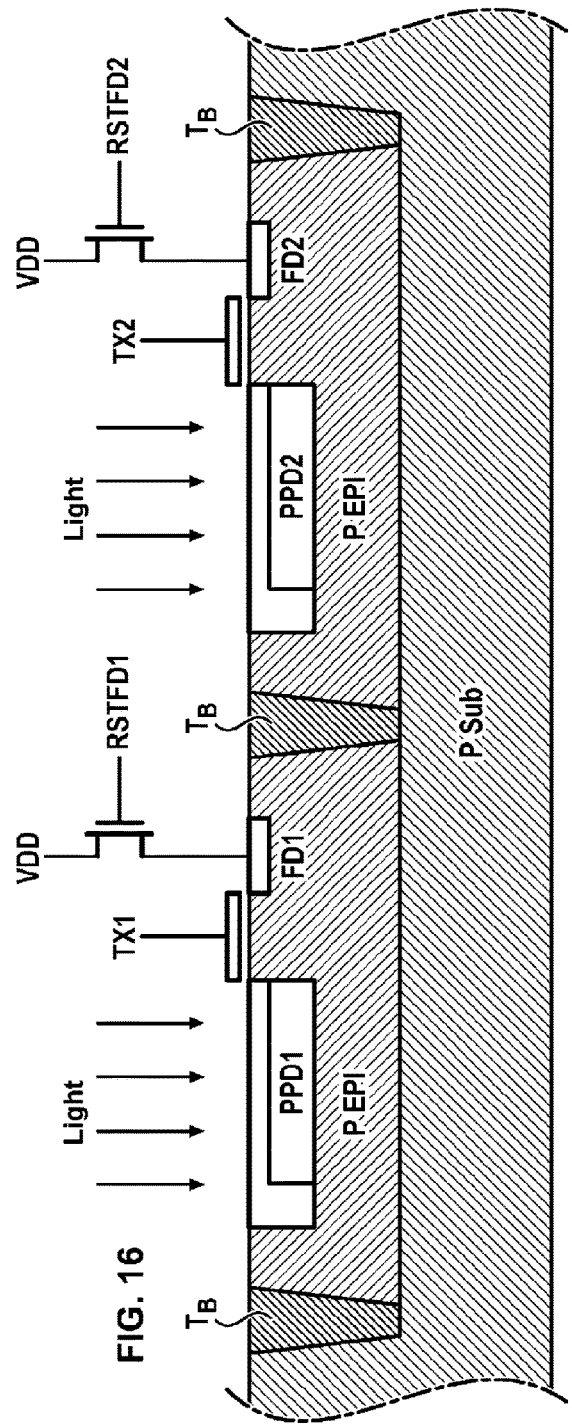
FIG. 15
FIG. 16

C-MOS PHOTOELECTRIC CHARGE TRANSFER CELL, AND MATRIX SENSOR COMPRISING A SET OF SUCH CELLS

FIELD OF THE INVENTION

The present invention relates in general to image sensors in C-MOS technology.

BACKGROUND OF THE INVENTION

The image quality provided by a C-MOS image sensor depends on multiple parameters two of which are particularly important: the level of noise and the dynamic operating range. A low level of noise produces an exploitable image in a low level of light, while an extended dynamic range improves quality in diurnal conditions, especially sunny. The dynamic range also conditions the tolerance of the sensor relative to the light spread in the same scene and the sudden variation in luminosity between the successive images.

Today, the level of noise of a CMOS charge transfer pixel, often called four-transistor pixel or simply 4T pixel, such as illustrated schematically in FIG. 1A, is almost reduced to the physical limit. This proper performance is essentially due to the use of a pinned photodiode (PPD), initially completely depleted, linked to a charge transfer gate to a floating diffusion node FD. Two correlated readings, performed before and after transfer of charges to the floating diffusion node, enables near-total cancelling of the reset noise (KTC noise proportional to capacitance).

Given that the pinned photodiode contains no mobile charges at the start of photo-conversion and after its transfer, it does not contribute to generation of KTC noise. Also, the photoelectric charge is measured on the floating diffusion FD, whereof the capacitance is dissociated from that of the photodiode. Accordingly the pinned photodiode collects the photoelectric charge only, which is then measured on the floating diffusion after transfer.

Low capacitance of the floating diffusion substantially increases variation in voltage by each transferred photoelectron, and this improves the overall signal-to-noise ratio, as the noise of the system remains relatively constant. For example, for background noise of a system at 160 µV, for a capacitance of 5 fF giving a variation in voltage of 32 µV per electron, this noise system equals 5 electrons on the floating diffusion FD. And with a capacitance of 1 fF for the floating diffusion FD, a background noise of 160 µV is reflected by 1 electron only.

The pixel structure with charge transfer has good sensitivity via a low value in capacitance of the floating diffusion FD and an effective charge transfer device, but the operating dynamic is reduced as a low capacitance of the floating diffusion zone FD prevents it from receiving large numbers of charges. For example, a capacitance of the floating diffusion zone FD of 5 fF on 1V of variation in voltage gives 31250 electrons, whereas 1 fF on 1V gives 6250 electrons only. This means that a 4T cell saturates very quickly. All current efforts are put into boosting the integration capacitance of the PPD and the storage capacitance of the floating diffusion FD.

The variation in voltage generated by an electron on a floating diffusion FD is defined as a conversion factor or gain. For example, a capacitance of the floating diffusion FD of 5 fF gives a conversion factor of 32 µV/e. The number of charges accepted by a pixel in its linear operating range is known as "Full Well Capacitance" (FWC). The FWC of a 4T pixel is limited either by the storage capacitance of the pinned photodiode or by the maximum number of charges acceptable by the floating diffusion FD.

The pinned photodiode PPD of FIG. 1A comprises as is known per se by N-doping in a substrate P, N-doping being covered by a fine layer of P-doping at very high dose. When the zone N (cathode) of the pinned photodiode is reverse-biased at a sufficiently high voltage, this zone N is completely depleted of mobile charges (electrons). This voltage noted as Vpin is called "pinning voltage"; it conditions the storage capacitance of photoelectrons per unitary surface in the photodiode. This explains use of strong surface doping which pushes the depletion zone as far as possible into the zone N to increase the value of the FWC capacitance for the same value Vpin. The voltage Vpin in a conventional pixel concept is fixed in general around 1V.

If the conversion factor of such a 4T pixel is relatively easy to increase due to the fineness of the etching used, the value of the FWC capacitance is more difficult to retain in the course to the resolution where the size of each pixel becomes smaller and smaller. It is simply clear that the ultimate physical limit of the FWC capacitance is the number of doping atoms in the photodiode. The low supply voltage in a C-MOS pixel results in a relatively low doping level and fairly restricted doping volume. It is therefore difficult to attain an operating dynamic of a 4T pixel beyond 60-70 dB (factor 1000). Applications such as video surveillance, automotive vision, etc. need a dynamic range of the order of 120 dB (factor 1,000,000).

Different approaches have been envisaged for increasing this dynamic, as summarized hereinbelow.

Document U.S. Pat. No. 6,921,934B2 proposes a structure for double pinned photodiode for increasing the storage capacitance of the photodiode.

Document U.S. Pat. No. 6,677,656B2 proposes a pinned photodiode with a P-layer for increasing the integration capacitance of the photodiode.

Document U.S. Pat. No. 7,705,900B2 proposes selectively combining severally floating diffusions for increasing the capacitance of the floating diffusion at a high lighting level.

Document WO2004/112376A1 proposes modulating the capacitance of the floating diffusion to adjust the conversion factor and the charge-measuring capacitance.

Document WO2012/092194A1 proposes modulation of the capacitance of the floating diffusion by programming voltage.

Document WO2007/021626A2 proposes selectively adding additional capacitance to the floating diffusion for increasing the charge-measuring capacitance.

It is reminded that document EP1354360A1, having the same inventor as that of the present patent application, describes a pixel with a photodiode in solar cell mode, producing a logarithmic response as a function of the light intensity. With the same inventor, patents EP2186318A1 and WO2010/103464A1 contribute improvements of compactness and power consumption. Sensors made according to these documents give an excellent operating dynamic in exhibiting almost no saturation even in very strong illumination. The operating dynamic largely exceeds 120 dB.

But these known pixel structures present a sensitivity which can be perfected and with difficulty can cover needs in low-level light imposed by applications such as surveillance. There are two reasons for this low sensitivity:

1) Substantial junction capacitance of the photodiode, giving a low conversion factor; but if the photodiode size is increased, it accepts more charges of photoelectric origin but the junction capacitance of the photodiode is almost increased in the same proportion. The amplitude of the signal remains unimproved. This low conversion factor amplifies the impact of noises present in the system.

2) The presence of KTC noise during reset: in such a logarithmic pixel the noise induced by the reset operation is linked to the value of the junction capacitance of the photodiode and cannot be compensated; for example, a junction capacitance of 10 fF gives a KTC noise of 40 electrons, so the noise situation in such a pixel is very close to that of a classic active pixel having 3 transistors. Compared to a 4T pixel where the KTC noise is totally suppressed, the distance is enormous in low-level light.

SUMMARY OF THE INVENTION

The present invention is based on a totally opposite approach to the traditional approach aimed at maximizing the integration capacitance of the pinned photodiode for increasing or retaining the operating dynamic.

Its aim is to reduce to a minimum static integration capacitance and exploit the residual charge in a pinned photodiode, left by the equilibrium between the photo-generation of electrons and their evaporation.

So the invention is based on a new operating mode for a charge transfer pixel, based on equilibrium between the phenomenon of photo-generation of electrons and a phenomenon of thermionic evaporation of electrons in a potential well with very low electrostatic barrier height.

By way of the invention the number of electrons in the photodiode codes the optic intensity on a logarithmic scale and not on a linear scale as in a classic pixel cell. This logarithmic law creates a much greater dynamic range for a given population of electrons that a classic cell responding to a linear law.

In this way the invention produces a charge transfer pixel capable of covering a dynamic range operating ranging beyond 120 dB.

More specifically, the invention proposes a photoelectric cell of the C-MOS type with charge transfer, of the type comprising a pinned photodiode likely to be exposed to photons, formed by a doped zone of a first type in a substrate of opposite type, and means for transferring the charges generated by exposure of the photodiode to photons to a floating diffusion, and means for reading on the floating diffusion a voltage representative of the transferred quantity of charges, the cell being characterized in that the depletion zone of the junction of the photodiode under zero biasing voltage extends essentially through the entire thickness of the doped zone of first type, such that the junction capacitance of said photodiode and the noise of capacitive origin are minimized, and in that during exposure to photons, reading is done under condition of equilibrium between generation of charges by photo-conversion and the loss of charges by evaporation.

Some preferred but non-limiting aspects of this cell are the following:
the reading means are capable of performing a first reading before transfer of charges of the photodiode, and a second reading after transfer of said charges, the level of light being obtained by the difference between the two readings.
the depletion zone of the photodiode extends over the entire extent of the photodiode under a biasing voltage of between 0 and −0.1 V.
the cell comprises means for resetting the photodiode before exposure.
the means for transferring charges comprise a gate on the surface of the semi-conductive substrate housing the photodiode, biased to induce transfer of charges immediately under said gate.
the means for transferring charges comprise means for lowering the potential barrier induced by drain biasing (DIBL).
the cell comprises a transistor capable under a first biasing of reading an initial voltage value on the floating diffusion, and under a second biasing of causing lowering of the potential barrier to transfer the charges of the photodiode to the diffusion barrier then, again under the first biasing of reading the voltage value on the floating diffusion after transfer.
the cell comprises a reading circuit of the voltage on the floating diffusion shared with at least one other cell.
the cell comprises a pinned charge storage diode located near the photodiode, and means for transferring the charge in the pinned photodiode to the pinned storage diode.

According to another aspect of the invention an array sensor is proposed, characterized in that it comprises a cell array as defined above, and means forming a barrier to diffusion of charges evaporated from one cell to an adjacent cell.

Some preferred but non-limiting aspects of this sensor are the following:
the means forming a barrier comprise deep zones of ions implanted for recombination of charges, these zones being arranged between the cells.
the means forming a barrier comprise deep trenches hollowed out in the substrate between the cells.
the means forming a barrier comprise deep zones inversely-doped of the substrate and biased, arranged between the cells.
the sensor further comprises surface zones with doping of the same type as that of the substrate, around the deep doped zones.
the means forming a barrier comprise a pinned semi-conductive junction, reverse-biased, arranged below the cells.

The invention also relates to a method for acquiring images by means of an array sensor comprising a cell array according to the invention, wherein the optic intensity to which said photoelectric cell is exposed is coded on a logarithmic scale by the number of charges in the residual charge in the pinned photodiode left by generation of charges by photo-conversion in the pinned photodiode and the loss of charges by thermionic evaporation in the pinned photodiode under condition of equilibrium between the generation of charges by photo-conversion in the pinned photodiode and the loss of charges by thermionic evaporation in the pinned photodiode.

More precisely, the intensity of the pixel of the image corresponding to a cell is determined from the number of charges in this residual charge by a logarithmic relationship. As the read voltage is representative of the transferred quantity of charges, and it corresponds to the residual charge, the intensity of the pixel of the image is linked to the voltage read by a logarithmic relationship from a certain lighting level.

BRIEF DESCRIPTION OF THE DRAWINGS

Other aspects, aims and advantages of the present invention will emerge more clearly from the following detailed description of preferred embodiments of the latter, given by way of non-limiting example and given in reference to the appended drawings, in which:

FIG. 13 illustrates a fifth embodiment of a pixel cell according to the invention, FIG. 14 illustrates a first embodiment of the insulation between cells of an array sensor according to the invention, FIG. 15 illustrates a second embodiment of the insulation between cells, FIG. 16 illustrates a third embodiment of the insulation between cells.

DETAILED DESCRIPTION OF PREFERRED EMBODIMENTS

Figure 1A:
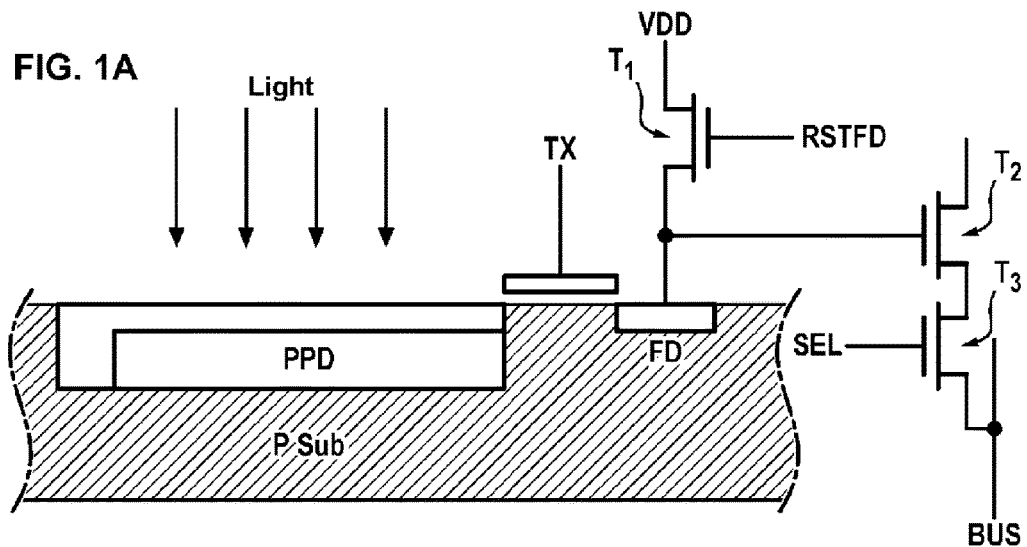
FIG. 1A illustrates a photo-electric cell with photodiode of the C-MOS type with charge transfer of 4 transistors type, according to the prior art.

First, it shall be noted that from one figure to the other identical or similar elements are designated where possible by the same reference numerals.

1) Introduction

Figure 2:
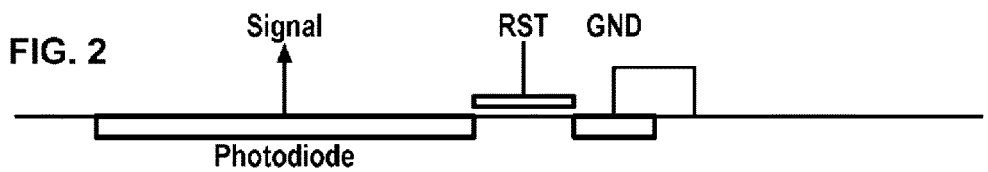
FIG. 2 illustrates the way in which KTC noise is engendered in a photodiode with short-circuit reset.

In reference to FIG. 2, a photodiode in solar cell mode is initialized by a transistor RST connected to the ground GND, causing short-circuit of the photodiode. This short-circuiting empties the net charge accumulated in its junction PN, but the cathode of the photodiode always contains mobile charges during this short-circuiting.

When the transistor RST is open, these mobile charges in the photodiode, which present fluctuation due to thermal movement of electrons, cause noise known as KTC where K is the Boltzmann constant, T is the absolute temperature, and C is the total capacitance of the photodiode, including the entry capacitance of the reading amplifier, this noise setting up an initial non-zero and random level of charge in the photodiode.

As is classic per se, the operating sequence consists of reading the voltage on the photodiode in open circuit, then reading the voltage on the photodiode in short-circuit, the image signal being the difference between these two readings. On completion of short-circuiting the KTC noise is left in the photodiode.

In a low level of light, this photodiode in solar cell mode functions partially in integration mode, the KTC noise being in the following image and degrading the image quality. In stronger illumination (daylight), the KTC noise is absorbed by the photodiode, biased directly by the photonic current. But movement of free electrons in the junction of the photodiode produces thermal noise (Johnson noise), which is of the same order of magnitude as the initial KTC noise.

A pixel cell which has a constant level of noise on a very large operating range is therefore produced. If the Johnson noise is less critical in diurnal illumination, the KTC noise in low-level light is very handicapping for performance of this type of logarithmic pixel.

Figure 3:
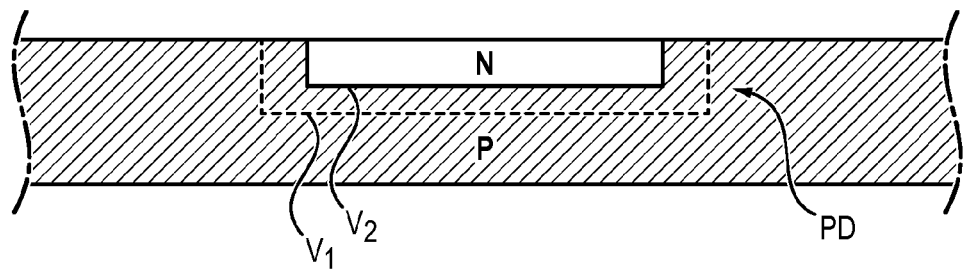
FIG. 3 illustrates a simple depleted photodiode at 0 V.

Reduction of the KTC noise can be obtained only by reducing the junction capacitance of the photodiode. FIG. 3 illustrates a photodiode with a volume V2 of the zone N reduced relative to a conventional volume V1, and a reduced doping level, this approach in the extreme creating total depletion of the cathode during short-circuiting. When the photodiode is completely depleted, there are therefore no more mobile charges (there are only fixed charges left by the donor atoms); and no KTC noise is engendered on completion of the short-circuiting phase.

But one difficulty is that as soon as the depletion zone touches the surface of the substrate, the quality of the junction is highly degraded due to surface defects inherent in such a substrate.

Figure 4:
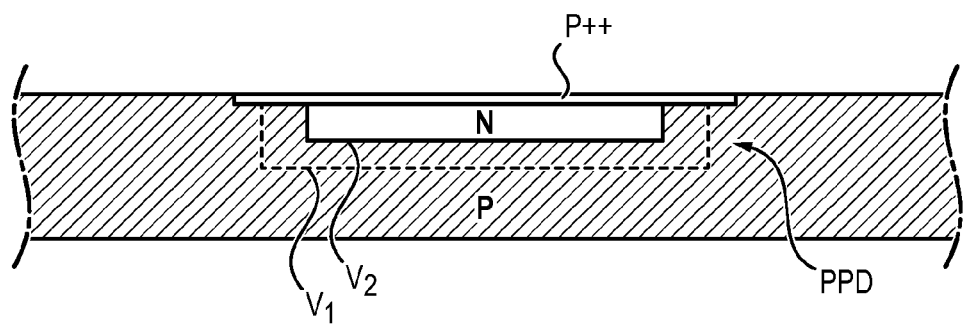
FIG. 4 illustrates a depleted photodiode, with superficial passivation layer.

As shown in FIG. 4, a P++ doping layer with strong dose above the photodiode will push the depletion zone back to the interior of the N doped zone. This therefore produces a pinned photodiode in the same way as in a charge transfer pixel, except that it is depleted at zero voltage, or even slightly negative voltage. But since its capacitance for accumulation is reduced to zero in static configuration, it cannot operate in terms of a pixel of classic 4T type.

Such a pinned photodiode completely depleted at zero volts does not integrate the charge of photoelectric origin as the electrostatic barrier does not statically confine electrons (holes, respectively) in the zone N (respectively P). I.e., in darkness an absence of mobile charges in the pinned photodiode is seen, irrespective of the duration of integration, therefore advantageously a zero dark signal even with a long exposure time.

But under a photon flow the appearance of mobile charges in the pinned photodiode occurs and as the number of these charges stabilizes becomes stable beyond a certain exposure duration, this stabilization corresponding to equilibrium between photoelectric generation of electrons and evaporation of electrons, capable of crossing the low potential barrier created around the photodiode.

Accordingly, reading on the floating diffusion of the voltage representative of the transferred quantity of charges is preferably done after an exposure time of the photodiode sufficiently long to achieve this equilibrium, and therefore stability of the residual charge.

In order to be able to read the value of the voltage linked to these charges, it would be necessary to place a conductive contact on the pinned photodiode. But such an approach would prevent complete depletion of the photodiode during its initialization, with such a conductive contact constituting an almost infinite reserve of electrons.

When the presence of contact is impossible, reading by transfer of the electric charge stored in the pinned photodiode becomes necessary. Means for transferring the residual charge to a floating diffusion are therefore provided. The quantity of charge stored in the photodiode has no linear relation as in a pixel with classic charge transfer as its static integration capacitance is theoretically zero. I.e., the quantity of charge does not increase as a function of time.

Figure 5:
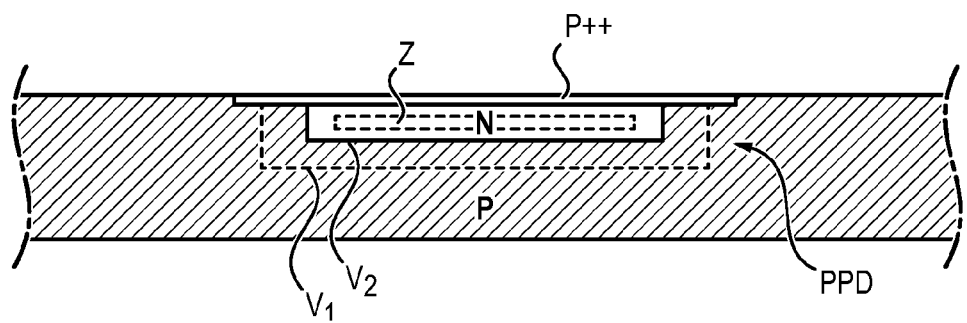
FIG. 5 illustrates the location of a reserve of free electrons of photo-electric origin in such a photodiode.

In reference now to FIG. 5, the fixed positive charges in the cathode zone always attract free electrons present nearby, generated by the photo-electric phenomenon.

At the same time, these free electrons, located in the non-depleted zone Z of the cathode, always tend to leave this zone due to thermal agitation and the repulsion force between electrons. When the potential barrier is sufficiently low, all free electrons leave the cathode and the pinned photodiode becomes completely depleted.

These two dynamic phenomena, namely collect of charges of photoelectric origin and loss of charges by evaporation, coexist in a pinned photodiode depleted at 0 V.

It shall be noted here that in a classic pinned photodiode of a conventional 4T pixel, evaporation is almost non-existent due to the height of the potential barrier created by Vpin (of the order of 1 V against 0 V or slightly negative in the case of a depleted photodiode).

This is why this type of pinned photodiode therefore functions as a pure accumulator of electrons, giving a linear response. The phenomenon of evaporation occurs only when the pixel is completely saturated, a blooming phenomenon takes place between adjacent pixels. In this case, a 4T pixel totally loses its aptitude to supply an exploitable image.

Considering always a pinned depleted photodiode of type N at a voltage Vpin of 0 V or negative, the number of electrons subsisting in the cathode zone can be represented by the following differential equation:

$$dN = \left(-N_0 e^{-\frac{V_{bi}+V_{pin}+V_D}{V_T}} + G\right)dt, \quad V_D = -\frac{qN}{C_{PPD}} \quad (1)$$

where $N_0, V_{bi}, V_T, G, C_{PPD}, q$ represent respectively the number of doping atoms, the electrochemical potential of the junction, thermal electron potential, photoelectric generation rate, capacitance of the pinned photodiode and the elementary charge.

In resolving this differential equation an essentially logarithmic relationship between the number of electrons in the cathode of the photodiode and the light intensity beyond a certain level of lighting is noted.

Figure 6:
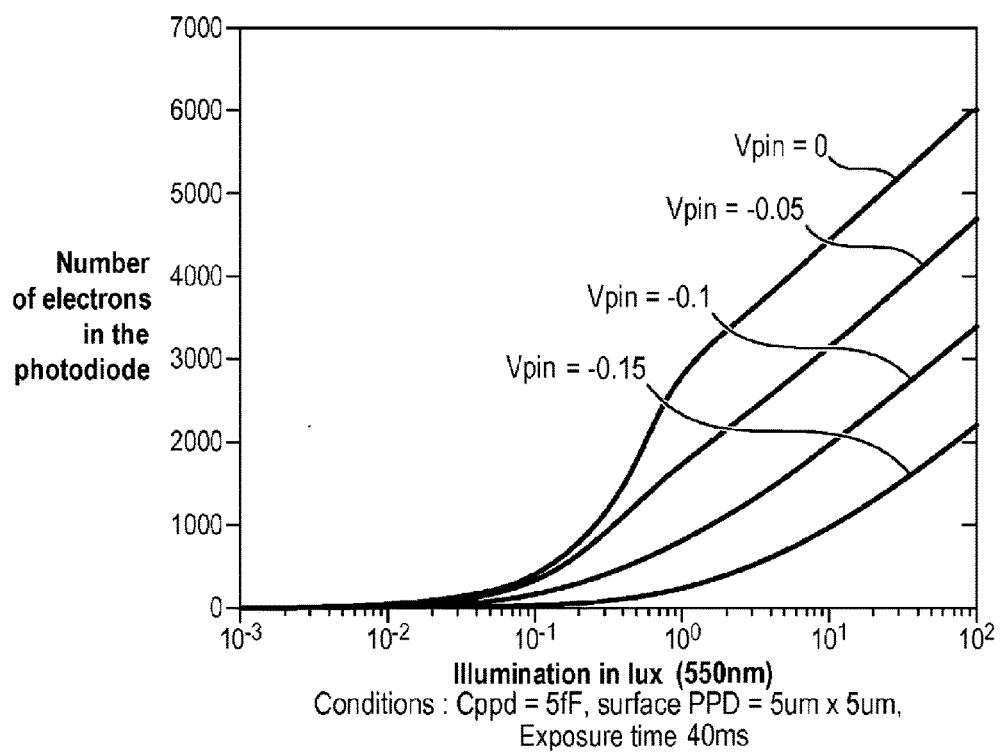
FIG. 6 illustrates response curves of a photodiode according to the invention under different voltages Vpin.

So FIG. 6 shows a set of curves expressing the relationship between the number of residual electrons in the cathode and the lighting in Lux (on an exponential scale), for different voltages Vpin (zero and slightly negative). It is seen that the curves have a considerable linear or almost-linear part (reflecting a logarithmic response given the exponential scale of the abscissae), and that it is for value Vpin of 0 V or −0.1 V that the best response is obtained qualitatively.

On a practical plane, the choice of this voltage Vpin can be made by calculating the probability an electron has of escaping from the pinned photodiode on completion of a preferred exposure time. Document "CCD Charge Injection Structure at Very Small Signal Levels", IEEE Transactions on Electron Devices, Vol. 55, No. 8 August 2008 gives useful details to the skilled person on the subject.

In summary, the present invention is based on an approach totally opposite to the traditional approach aimed at maximizing the integration capacitance of the pinned photodiode to increase or retain the operating dynamic. By contrast, here the static integration capacitance has been reduced to a minimum and the residual charge in the pinned photodiode, left by the equilibrium between the photo-generation of electrons and their evaporation, is exploited.

In this way the number of electrons in a photodiode according to the present invention codes the optic intensity on a logarithmic scale and not on a linear scale as in a classic pixel cell. This logarithmic law codes the optic signal over a much greater dynamic range, for a given population of electrons, than a classic cell responding to a linear law.

More precisely, with the maximum electrons available being limited by the number of doping atoms, a reduction in size of the pixel correspondingly reduces the number of doping atoms, and the fact of being able to code the optic intensity on a logarithmic scale considerably extends the dynamic operating range. For example, in a volume of 1 μm×1 μm×0.5 μm having a doping level of $10^{16}$ dopants/$cm^3$, the maximum free electrons is 5000 and can code only a variation from 1 to 5000 (or 74 dB). In logarithmic mode, if it is supposed that an electron codes a relative variation by 0.5% (value corresponding to the discrimination threshold of the human eye), 5000 electrons can cover a range above 200 dB.

2) Embodiments a) Embodiment No. 1

Figure 7:
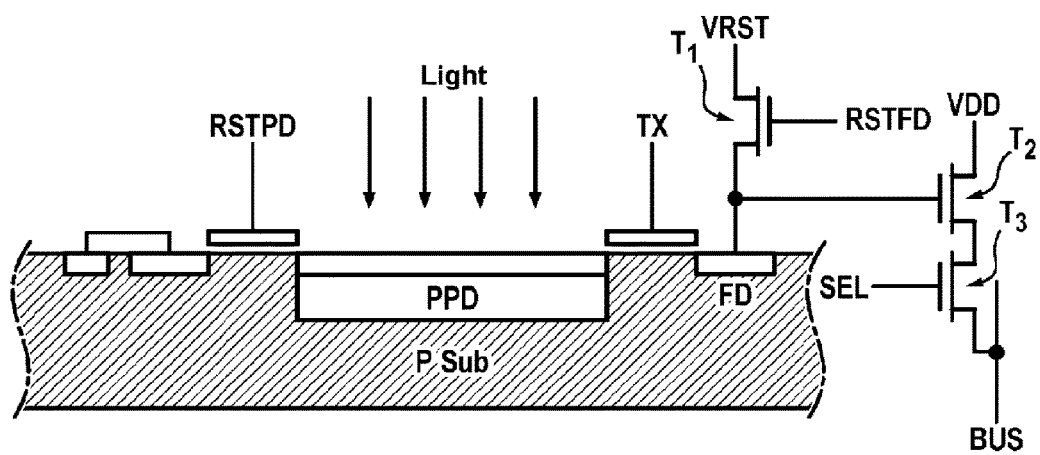
FIG. 7 illustrates a first embodiment of a pixel cell according to the invention.

In reference first of all to FIG. 7, this shows a cell made via C-MOS technology, which comprises a pinned photodiode of PPD ("Pinned Photo-Diode") type in a P Sub doped substrate, this photodiode being reset to zero by a transistor receiving a RSTPD signal at the start of exposure. After exposure, a floating diffusion FD is first reset by a transistor T1 receiving a RSTFD command at a reference voltage VRST. A first reading is performed using the pair of transistors T2, T3 to a reading bus (BUS). A transfer transistor TX is then activated such that the residual charge of the pinned photodiode is transferred to the floating diffusion zone FD, causing a variation in voltage on the floating diffusion FD. A second reading is performed using transistors T2, T3 to the reading bus BUS. The difference between the two readings gives an image signal of the pixel, exempt of KTC noise. This pixel cell can be placed in an array in association with control signals similar to those provided for an array of conventional pixels of type 4T.

For good uniformity of response, it must be ensured that the height of potential barriers created under the initialization transistor RSTPD and under the gate of the transistor TX are higher than the potential of the substrate P. In this way, electronic evaporation will occur essentially only on the substrate as the barrier under the transistor TX always has strong dispersion due to surface states of the silicon immediately under the gate.

More generally, charge evaporation passing via the surface of the semi-conductor must be avoided. For this reason, low-depth implantation of surface type P is advantageously provided to enhance the potential barrier at the surface. This implantation is similar to field implantation currently used in the standard C-MOS process. It is clear that this precaution is applicable to all embodiments of the invention, and with his general knowledge the skilled person can apply other techniques to channel evaporation of electrons inside the semi-conductor.

It is preferable for the pinned photodiode PPD to be completely depleted under a voltage Vpin of 0 V. As a consequence, a slightly negative total depletion voltage is preferable. In the contrary case, a low residual charge would exist in the pinned photodiode, which would engender KTC noise and degrade performance of the pixel.

It shall be noted here that the fact of providing a transistor dedicated specifically to reset of the pinned photodiode ensures better uniformity of the image in the event where the cell forms part of an array sensor.

b) Embodiment No. 2

Figure 1B:
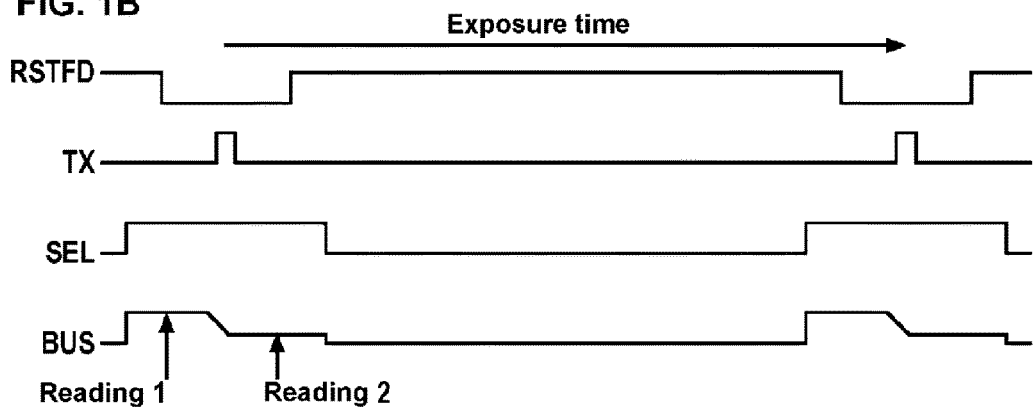
FIG. 1B is the operating chronogram of the cell of FIG. 1A.
Figure 8:
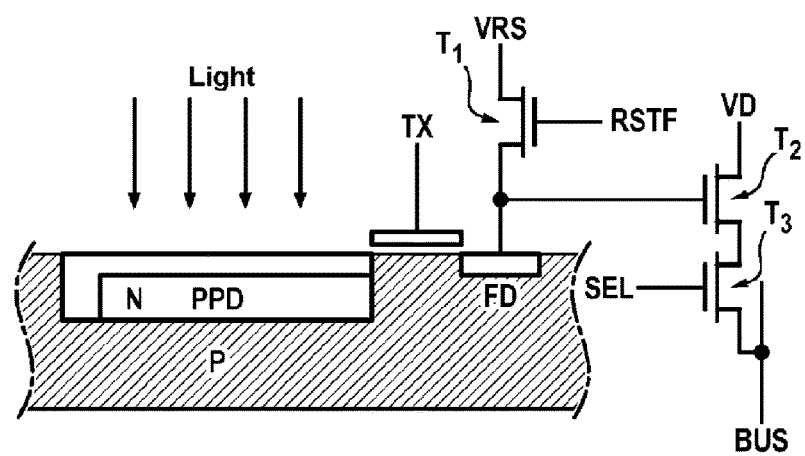
FIG. 8 illustrates a second embodiment of a pixel cell according to the invention.

It is understood that in the first embodiment the transfer of charges during reading of the pinned photodiode empties the latter completely of its mobile charges. If the doping uniformity in the pinned photodiode is controlled, the reset transistor is no longer necessary. FIG. 8 illustrates a second embodiment where the photodiode is devoid of reset transistor and where the reading sequence of the pixel is identical to that illustrated in FIG. 1B.

This sequence begins by reset of the floating diffusion zone FD. A first reading is then performed to the bus BUS and a second reading is performed after the transfer action of charges made by the transistor TX. Here too, the image signal comprises the difference between the two readings. It is understood that the following exposure begins directly after completion of the TX action. It will be noted that this embodiment better tolerates variations in the voltage Vpin, of which it is recalled that it is close to 0. So a positive variation of Vpin does not generate KTC noise as it is certain that the photodiode is completely depleted at the start of exposure. This variation slightly affects the form of the response of the pixel in low-level light.

c) Embodiment No. 3

Due to the etching fineness permitted in C-MOS technology, it is technically possible to make two diffusion zones very close to each other in a substrate.

But when two diffusion zones are very close, there is a lowering of potential barrier when one of these diffusions is biased at high voltage. This known phenomenon, called "Drain-Induced Barrier Lowering" (DIBL), can be used advantageously for transfer of charges between the pinned photodiode and the floating diffusion FD. In a classic 4T pixel, the height of the potential barrier of the pinned photodiode is high (the height of the barrier is the sum of the voltages Vpin and Vbi of the pinned photodiode, Vbi being the electrochemical potential of the junction PN). It is difficult to exploit this phenomenon for a complete charge transfer. But in a pinned photodiode of Vpin close to 0V, it is possible to make a complete charge transfer without using a very high voltage.

Figure 9:
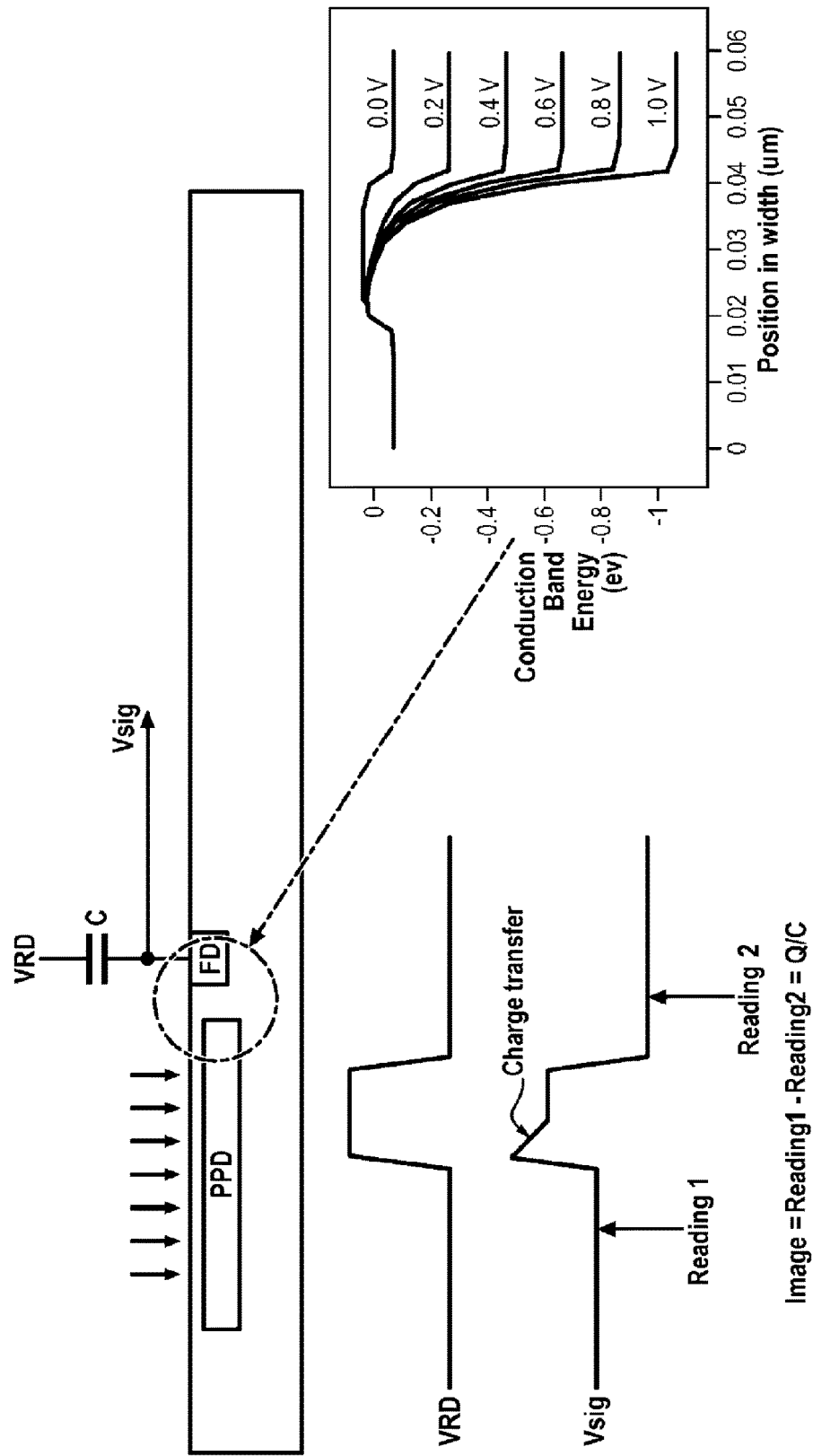
FIG. 9 illustrates a charge transfer by DIBL phenomenon in a cell according to the invention.

FIG. 9 illustrates a charge transfer made no longer by biasing of a gate, but by DIBL phenomenon. A reading command VRD is applied to the floating diffusion FD via a condenser C. When the signal VRD has the form of a pulse at a sufficiently high level, this voltage is transmitted to the floating diffusion zone FD via the condenser C and causes lowering of the potential barrier and consequently charge transfer, a voltage Vsig then able to be read on the floating diffusion FD.

Here too, the difference between the two readings of the voltage on the floating diffusion FD before and after the pulse VRD gives the transferred quantity of charges.

Figure 10:
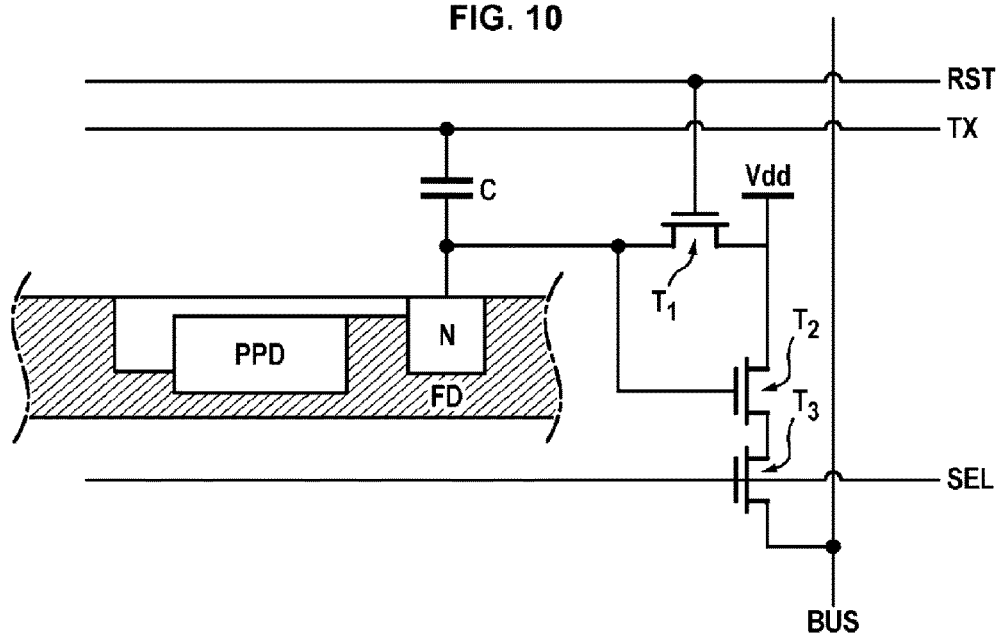
FIG. 10 illustrates a third embodiment of a pixel cell according to the invention performing such a transfer.

FIG. 10 illustrates the main diagram of such a charge transfer cell by DIBL. The floating diffusion zone FD is reset by a transistor T1 applying thereto a high reset voltage Vdd in response to the signal RST. A pulse on the signal TX then causes barrier lowering between the photodiode PPD and the floating diffusion zone FD. The two successive readings to the bus BUS are made via the command SEL before and after the pulse TX, and the difference between these two readings gives the image signal, again devoid of capacitive noise KTC.

Figure 11:
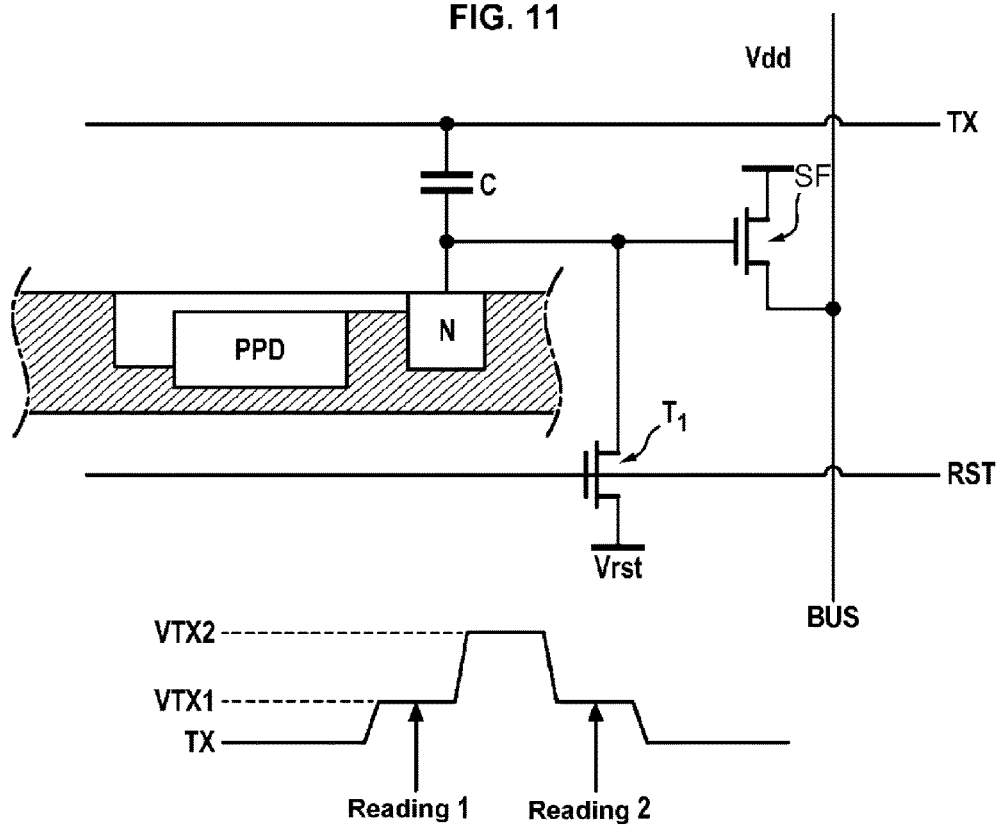
FIG. 11 illustrates a variant of this third embodiment, more compact.

FIG. 11 represents a modified block diagram, enabling a more compact realization by saving a selection transistor. In this way the floating diffusion zone FD is initialized at a voltage located below the threshold of the transistor of the voltage follower SF. The signal TX is a command with 2 levels. After reset of the floating diffusion FD, the signal TX rise to a first level $V_{TX1}$ for putting the follower transistor SF in a conductive state, and a first reading is performed on the bus BUS. Next, the signal TX rises to the second level $V_{TX2}$, of higher voltage, causing charge transfer by DIBL effect between the photodiode and the floating diffusion FD. A second reading is then performed after the signal TX has returned to the first level $V_{TX1}$. Again, an image signal devoid of KTC noise is obtained by the difference between the two readings.

It shall be noted here that, in the event where the threshold voltage of the transistor SF is sufficiently low and where the condenser C is capable of tolerating a sufficiently high voltage on the command line TX, the reset transistor T1, and its command line, can be deleted, making the cell even more compact. In fact, the floating diffusion is normally discharged by light during the exposure period, making the amplifying transistor T4 blocking. A sufficiently high value of $V_{TX1}$ unblocks the latter to take the reading.

d) Embodiment No. 4

Figure 12:
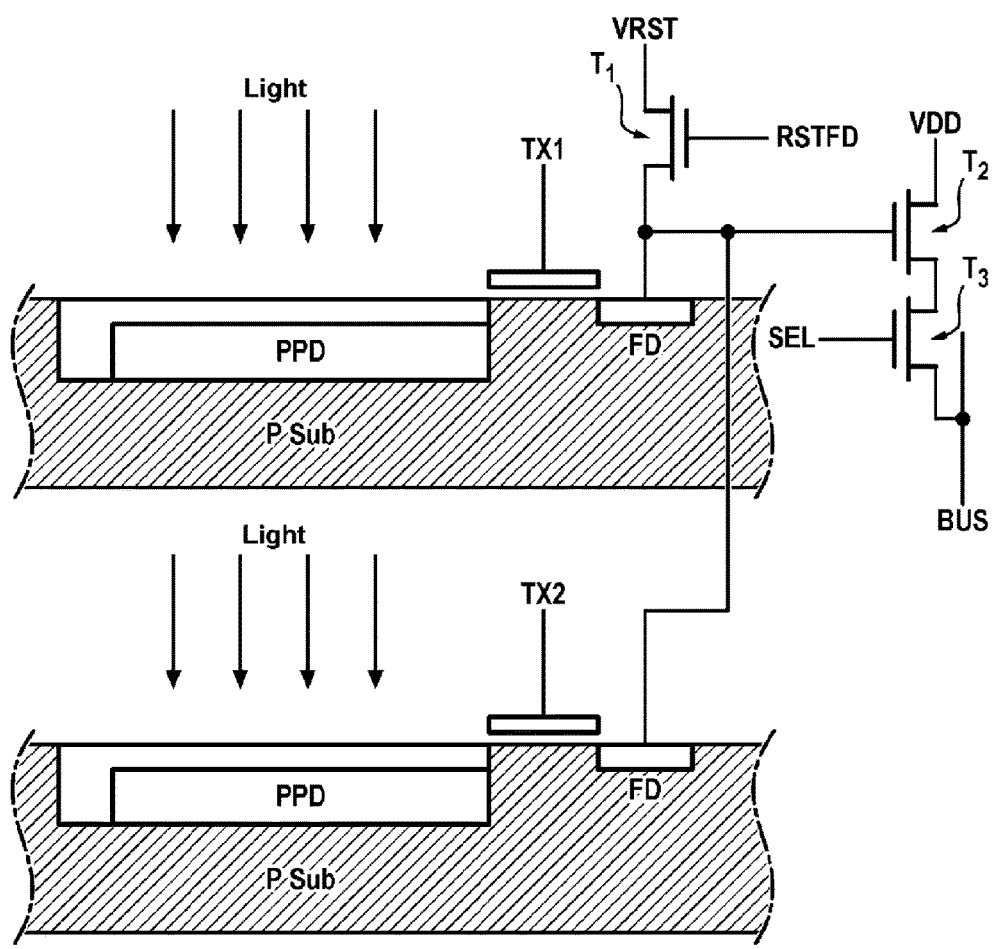
FIG. 12 illustrates a fourth embodiment of a pixel cell according to the invention.

In order to minimize the size of a pixel, this other embodiment proposes sharing an output follower by a set of photodiodes corresponding to different cells. FIG. 12 shows such an arrangement with two cells. The diffusion zones FD1 and FD2 are initialized at each reading. The two photodiodes PPD1 and PPD2 with two transfer transistors TX1 and TX2 respectively are read sequentially.

It is understood that the number of photodiodes read by a common voltage follower can be increased.

e) Embodiment No. 5

FIG. 13 illustrates an embodiment of a logarithmic charge transfer pixel according to the invention, provided with a memory within the pixel. As before, the residual photoelectric charge of the pinned photodiode is first transferred to a pinned storage diode PPD_mem before being read by means of the transfer gate TX and the floating diffusion zone FD as before. This in-situ memory executes an image sensor so-called "snapshot" where the light values generated by the whole set of pinned photodiodes of the sensor are read at the same moment. The image is stored in the storage diodes PPD_mem of all the cells at the same moment, before being read sequentially by the bus BUS. The storage diode PPD_mem can be advantageously made at the same time as the photodiode PPD, according to the same method. It simply must be masked relative to the light, for example by an opaque layer.

FIG. 14 illustrates a variant of this embodiment after completion of the structure by adding a reset transistor for resetting all the pinned photodiodes simultaneously to implement an electronic blocking function.

f) Improvement of Resolution

In a cell according to the invention, the mobile charges evaporated from the pinned photodiode are injected into the substrate. If the density of the array pixels of the sensor is low, these charges can recombine naturally. But if the pixel array is dense, then the evaporated charges from a pixel are likely to diffuse to the adjacent pixels and degrade the spatial resolution of the pixel array.

To avoid this phenomenon, according to a refinement of the invention, insulation structures are provided between the pixels and a certain number of configurations and will be described hereinbelow for this purpose, as non-limiting.

i) Insulation by Recombination Centers by Implantation

Ionic implantation is capable of generating many crystalline defects in a substrate. If annealing is absent or insufficient, these defects persist and become effective recombination centers. Also, implantation of protons can penetrate deeply into a substrate with reasonable energy (for example 6 μm in depth at only 550 KeV). In this insulation method, protons are implanted in neutral zones $IP_B$ (absence of photodiodes and transistors) around the pixels so that the evaporated charges recombine in these zones.

ii) Insulation by Deep Trench

The pixels in an array can also be enclosed by deep trenches. In general, an epitaxial wafer EPI is used in making CMOS sensors. Such a wafer EPI has a thin lightly doped epitaxial layer (dosage of the order of $1.10^{15}$) on a strongly doped substrate (dosage above $1.10^{18}$). In the strongly doped substrate, the lifetime of the mobile charges is very short due to a strong recombination rate. Very good insulation between the pixels can result from hollowing out deep trenches $T_B$ passing fully through the epitaxial layer. FIG. 16 illustrates such a configuration.

iii) Insulation by PN Junctions

Figure 17:
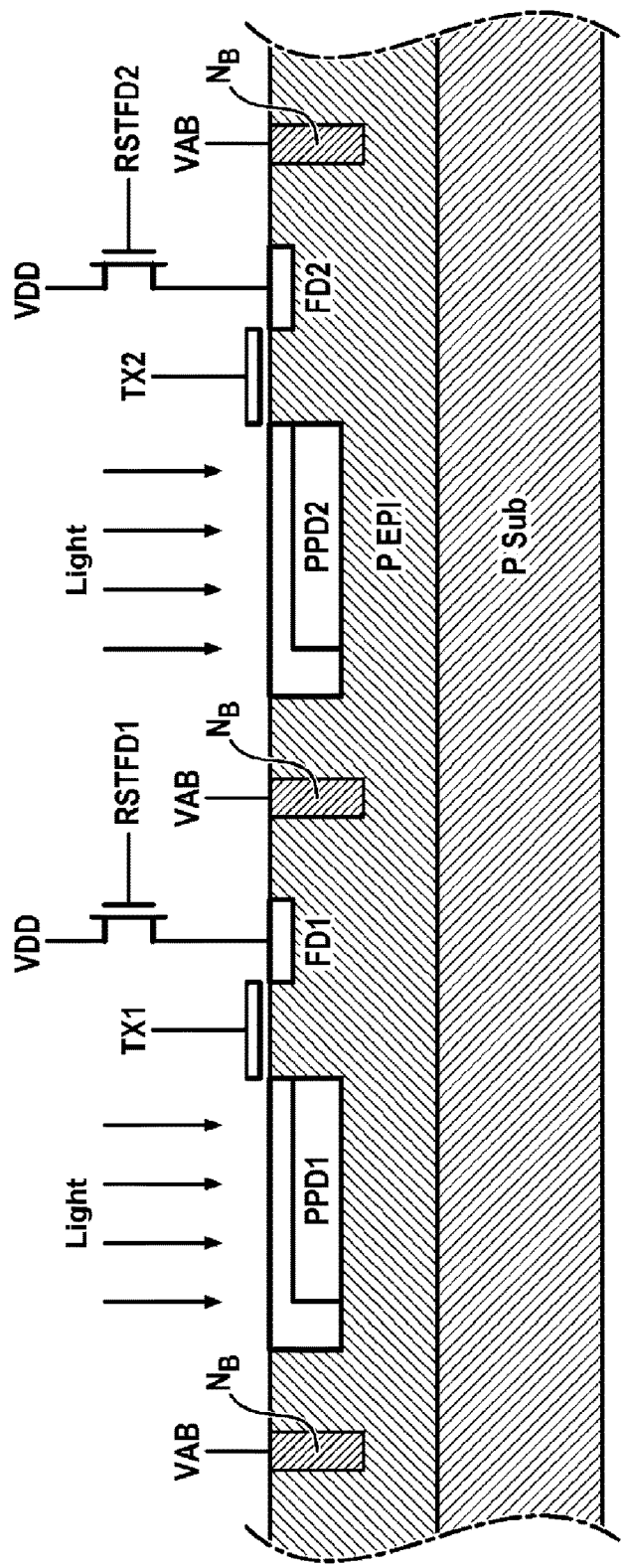
FIGS. 17 and 18 illustrate a fourth embodiment of the insulation between cells, FIG. 18 being a variant of FIG. 17.
Figure 18:
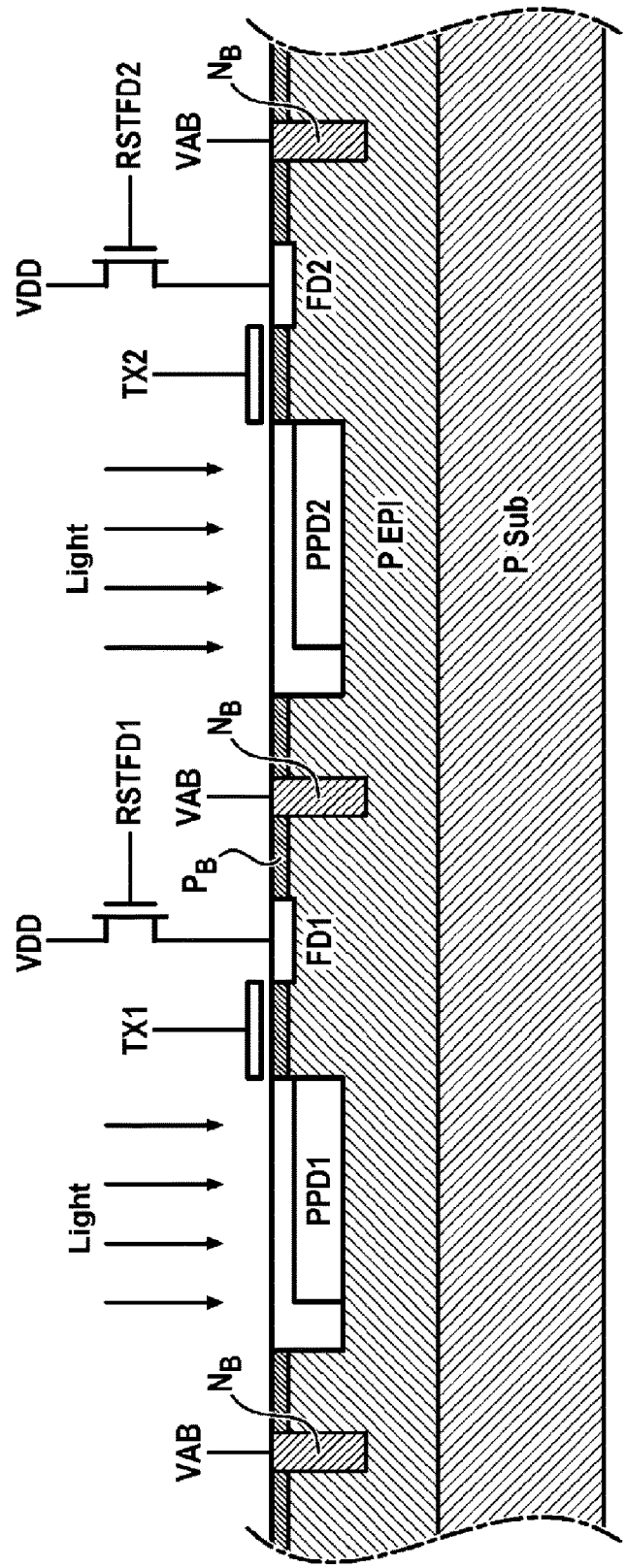

In another variant, N-doped zones $N_B$ are made in between the pixels in an array to form absorption zones of evaporated electrons. This is illustrated in FIG. 17. These zones $N_B$ are reverse-biased by a positive voltage VAB. The positive supply voltage Vdd of the pixel can advantageously be used for this purpose. These absorption zones of evaporated electrons must preferably have a depth at least equal to that of the pinned photodiode PPD. As illustrated in FIG. 18, a thin layer $P_B$ of P-doping for increasing the height of the electrostatic barrier at the surface can advantageously be implanted on the surface P of the layer EPI, so that absorption of evaporated charges takes place mainly inside the semi-conductor relative to this layer P. This improves the uniformity of the action of the reverse biasing voltage in the pixel array, confining circulation of electrons in the pinned zone rather than at the surface where defects create irregularities.

iv) Insulation by Vertical PN Junctions

Figure 19:
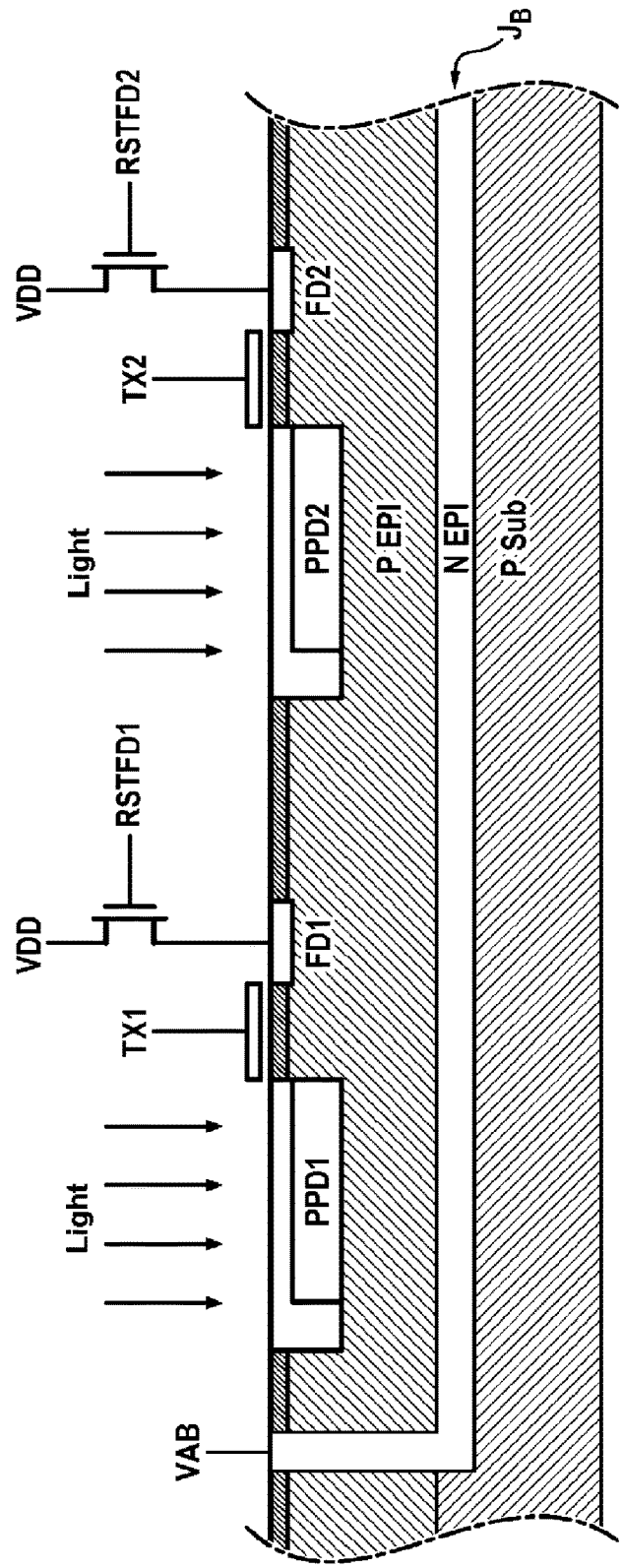
FIG. 19 illustrates a fifth embodiment of the insulation between cells.

Creating wafers with specially made epitaxy makes it possible to place an epitaxed layer N EPI under the epitaxied layer P EPI, as illustrated in FIG. 19. Reverse biasing is applied to the junction $J_B$ between the layer P EPI and the layer N EPI. This structure effectively absorbs the evaporated charges without adding additional devices in the pixels. The layer N EPI can be either a layer in a single piece under the entire pixel array, or a mesh under the pinned photodiodes of the array.

Of course, the present invention is not limited to the embodiments described and illustrated, but the skilled person can suggest many variants and modifications.

In particular, even though embodiments have been described hereinabove with a P-doped substrate, the present invention can genuinely be executed in a complementary configuration, with an N substrate, the charges being the holes and no longer the electrons.

The invention claimed is:

1. A photoelectric cell of a CMOS type with charge transfer, of a type comprising a pinned photodiode adapted to be exposed to photons, formed by a doped zone of a first type in a substrate of opposite type, and means for transferring charges generated by exposure of the pinned photodiode to the photons to a floating diffusion, and means for reading on the floating diffusion a voltage representative of a transferred quantity of charges, wherein a depletion zone of the junction of the pinned photodiode under zero biasing voltage extends essentially through an entire thickness of the doped zone of the first type, such that a junction capacitance of said pinned photodiode and a capacitive noise are minimized, and wherein during exposure to the photons, a transferred quantity of charges corresponds to a residual charge left in the pinned photodiode by the generation of charges by photo-conversion in the pinned photodiode and a loss of charges by thermionic evaporation in the pinned photodiode, and wherein reading of a voltage representative of the transferred quantity of charges is done under condition of equilibrium between generation of charges by the photo-conversion in the pinned photodiode and the loss of charges by the thermionic evaporation in the pinned photodiode.

2. The photoelectric cell according to claim 1, wherein the reading means are capable of performing a first reading before transfer of charges of the pinned photodiode, and a second reading after transfer of said charges, a level of light being obtained by calculating a difference between the first reading and the second reading.

3. The photoelectric cell according to claim 1, wherein a depletion zone of the pinned photodiode extends over an entire extent of the pinned photodiode under a biasing voltage of between 0 and −0.1 V.

4. The photoelectric cell according to claim 1, further comprising means for resetting the pinned photodiode before exposure.

5. The photoelectric cell according to claim 1, wherein the means for transferring charges comprise a gate on a surface of the substrate housing the pinned photodiode, said gate biased to induce transfer of charges immediately under said gate.

6. The photoelectric cell according to claim 1, wherein the means for transferring charges are configured to lower a potential barrier induced by drain biasing.

7. The photoelectric cell according to claim 6, further comprising a transistor capable under a first biasing of reading an initial voltage value on the floating diffusion, and under a second biasing of causing lowering of a potential barrier to transfer the charges of the photodiode to the diffusion barrier then, again under the first biasing of reading the voltage value on the floating diffusion after transfer.

8. The photoelectric cell according to claim 1, further comprising a reading circuit of the voltage on the floating diffusion shared with at least one other cell.

9. The photoelectric cell according to claim 1, further comprising a pinned charge storage diode located near the pinned photodiode and the means for transferring the charges in the pinned photodiode to the pinned charge storage diode.

10. An array sensor comprising cells, wherein at least one of the cells is a photoelectric cell according to claim 1, and an insulation structure forming a barrier to diffusion of charges evaporated from one cell to an adjacent cell.

11. The array sensor according to claim 10, wherein the insulation structure comprises deep zones of ions implanted for recombination of charges, said deep zones being arranged between the cells.

12. The array sensor according to claim 10, wherein the insulation structure comprises deep trenches hollowed out in the substrate between the cells.

13. The array sensor according to claim 10, wherein the insulation structure comprises deep zones inversely-doped of a doping of the substrate and biased, arranged between the cells.

14. The array sensor according to claim 13, further comprising surface zones with doping of a same type as a type of the substrate, around the deep doped zones.

15. The array sensor according to claim 10, wherein the insulation structure comprises a pinned semi-conductive junction, reverse-biased, arranged below the cells.

16. A method comprising:
providing a photoelectric cell of a C-MOS type with charge transfer, of a type comprising a pinned photodiode adapted to be exposed to photons, formed by a doped zone of a first type in a substrate of opposite type, and means for transferring charges generated by exposure of the pinned photodiode to the photons to a floating diffusion, and means for reading on the floating diffusion a voltage representative of a transferred quantity of charges, wherein a depletion zone of the junction of the pinned photodiode under zero biasing voltage extends essentially through an entire thickness of the doped zone of the first type, such that a junction capacitance of said pinned photodiode and a capacitive noise are minimized, and wherein during exposure to the photons, a transferred quantity of charges corresponds to a residual charge left in the pinned photodiode by the generation of charges by photo-conversion in the pinned photodiode and a loss of charges by thermionic evaporation in the pinned photodiode,
reading a voltage representative of the transferred quantity of charges under condition of equilibrium between generation of charges by the photo-conversion in the pinned photodiode and the loss of charges by the thermionic evaporation in the pinned photodiode.

17. The method according to claim 16, wherein an optic intensity to which said photoelectric cell is exposed is coded on a logarithmic scale by a number of charges in a residual charge in the pinned photodiode left by generation of charges by the photo-conversion in the pinned photodiode and the loss of charges by thermionic evaporation in the pinned photodiode under condition of equilibrium between the generation of charges by the photo-conversion in the pinned photodiode and the loss of charges by thermionic evaporation in the pinned photodiode.

* * * * *